United States Patent
Fan

(12) 
(10) Patent No.: US 6,743,485 B2
(45) Date of Patent: Jun. 1, 2004

(54) PRE-TREATMENT FOR SALICIDE PROCESS

(75) Inventor: Su-Chen Fan, Taoyuan Hsien (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 10/074,151

(22) Filed: Feb. 11, 2002

(65) Prior Publication Data
US 2002/0112951 A1 Aug. 22, 2002

Related U.S. Application Data

(63) Continuation of application No. 09/777,583, filed on Feb. 6, 2001, now abandoned, which is a continuation of application No. 09/417,357, filed on Oct. 13, 1999, now Pat. No. 6,254,739.

(30) Foreign Application Priority Data

Sep. 6, 1999 (TW) .................................. 88115321 A

(51) Int. Cl.$^7$ .......................... C23C 8/00; C23C 14/34; B44C 1/22; B05D 3/02
(52) U.S. Cl. ................. 427/585; 204/192.2; 204/192.3; 216/37; 216/55; 427/299; 427/383.1
(58) Field of Search ...................... 204/192.15, 192.2, 204/192.3, 192.37; 216/37, 55; 427/299, 585, 383.1

(56) References Cited

U.S. PATENT DOCUMENTS 5,178,739 A * 1/1993 Barnes et al. .......... 204/192.12
5,360,765 A * 11/1994 Kondo et al. ............... 438/656
6,254,739 B1 * 7/2001 Fan ...................... 204/192.15

* cited by examiner

Primary Examiner—Steven Versteeg
(74) Attorney, Agent, or Firm—J.C. Patents

(57) ABSTRACT

A method for treating a silicon substrate is described. The silicon substrate is placed into a sputtering equipment. A sputtering step is performed to simultaneously dry clean and amorphize the silicon substrate surface by using the sputtering equipment. A titanium film is deposited on the silicon substrate by the sputtering equipment.

6 Claims, 5 Drawing Sheets

PRE-TREATMENT FOR SALICIDE PROCESS

CROSS-REFERENCE TO RELATED APPLICATION

This application is a continuation application of, and claims the priority benefit of, U.S. application Ser. No. 09/777,583 filed Feb. 6, 2001, now abandoned, which in turn is a continuation of application Ser. No. 09/417,357 now U.S. Pat. No. 6,254,739 filed on Oct. 13, 1999.

BACKGROUND OF THE INVENTION

1. Field of Invention

The present invention relates to a surface treatment technology. More particularly, the present invention relates to surface treatment for a salicide process.

2. Description of Related Art

An integrated circuit (IC) is produced by a very complicated process. Generally, the complicated process consists of several hundred processing steps, and last about one or two months. During IC production, engineers use many modern technologies and inventions. Because these modern technologies and inventions are advanced but expensive, the IC industry is a highly risky industry that needs enormous investment for support. For this reason, any simplification or combination for those processing steps contributes much to the cost and time reduction for the process as a whole.

Conventionally, the formation of titanium silicide is performed by depositing titanium onto a silicon substrate, followed by rapid thermal annealing (RTA). This titanium layer can be deposited by $TiCl_4$-based CVD and silicidation is accomplished in situ during glue layer deposition. The process temperature for $TiCl_4$-based Ti is as high as about 650° C. while that of a conventional PVD Ti is only about 200° C. Moreover, the PVD has a deposition rate which is typically several times higher than that of CVD. Therefore, the fast PVD facilitates cost reduction, while the slow $TiCl_4$-based CVD has high thermal budget that leads to difficulty in controlling junction leakage.

FIG. 1 is a flow chart schematically illustrating a conventional salicide process and the pre-processing steps thereof. The figure shows nine processing steps comprising the above-mentioned PVD and amorphization. First, on a silicon substrate having a polysilicon gate thereon, step 110 is performed to form an oxide spacer on the sidewall of the polysilicon gate. Steps 125 and 102a. belong to an amorphization process 120, are performed to amorphize the polysilicon gate and the substrate surface. The amorphizing steps 125, 102a, performed in an ion implanter, have a purpose of accelerating the subsequent metal deposition on the substrate. After the amorphizing steps 125, 102a are performed, the surfaces of the substrate, the polysilicon gate and the oxide spacer are wet cleaned as shown in step 130.

After this wet cleanings 130, the substrate and the devices thereon are then conveyed from the ion implanter to a sputtering equipment. Step 145 and step 150a. belong to a sputtering process 140, are performed in this sputtering equipment. In step 145, the surfaces of the substrate, the polysilicon gate and the oxide spacer are dry cleaned by sputtered argon. In step 150a, the substrate is covered with a sputtered metal film. The processing steps 120, 130, 145, performed before the metal covering step 150a, serve as pre-treatment for a salicide process.

Then, in a first annealing step 150b, the metal film thermally reacts with the exposed substrate and polysilicon gate to form silicide films. Step 150c then selectively etches the unreacted metal from regions such as the oxide spacer. After the first annealing step 150b, the silicide films are typically in a high-resistance phase. For this reason, after the etch step 150c. a second annealing step 150d is then performed to transform the silicide films into the desired low-resistance phase.

The conventional salicide process and pre-treatment thereof total nine processing steps in all. In the processing steps, the amorphization steps and the sputtering steps should be separately performed in different equipment units, thereby increasing the process complexity. Furthermore, the pre-treatment for the salicide process comprises five processing steps, is also complex and therefore increases the process costs and time. To save process costs and time, there is a need for a method that can simplify or combine those processing steps.

SUMMARY OF THE INVENTION

The present invention is directed to a method for treating a silicon substrate. The silicon substrate is placed into a sputtering equipment. A sputtering step is performed to simultaneously dry clean and amorphize the silicon substrate surface by the sputtering equipment. A titanium film is deposited on the silicon substrate by the sputtering equipment.

In one embodiment of this invention, the titanium film is deposited at about 540° C. by an ionized metal plasma (IMP) equipment.

In this present invention, the sputtering and the deposition steps are performed in the same chamber, thereby improving the wafer throughput.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
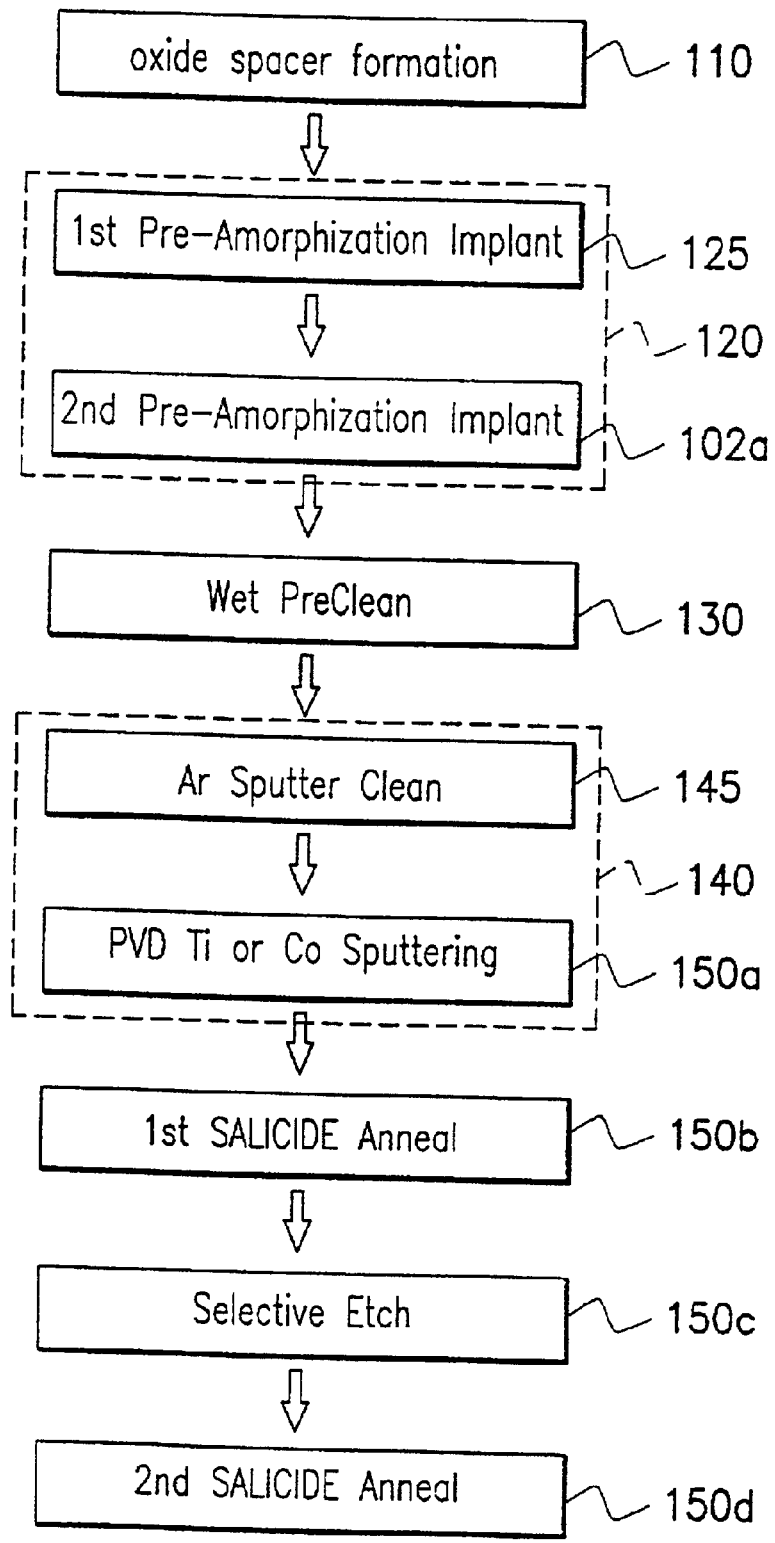
FIG. 1 is a flow chart schematically illustrating a conventional salicide process and the pre-processing steps thereof

Reference will now be made in detail to the present preferred embodiments of the invention, examples of which are illustrated in the accompanying drawings. Wherever possible, the same reference numbers are used in the drawings and the description to refer to the same or like parts.

Figure 2:
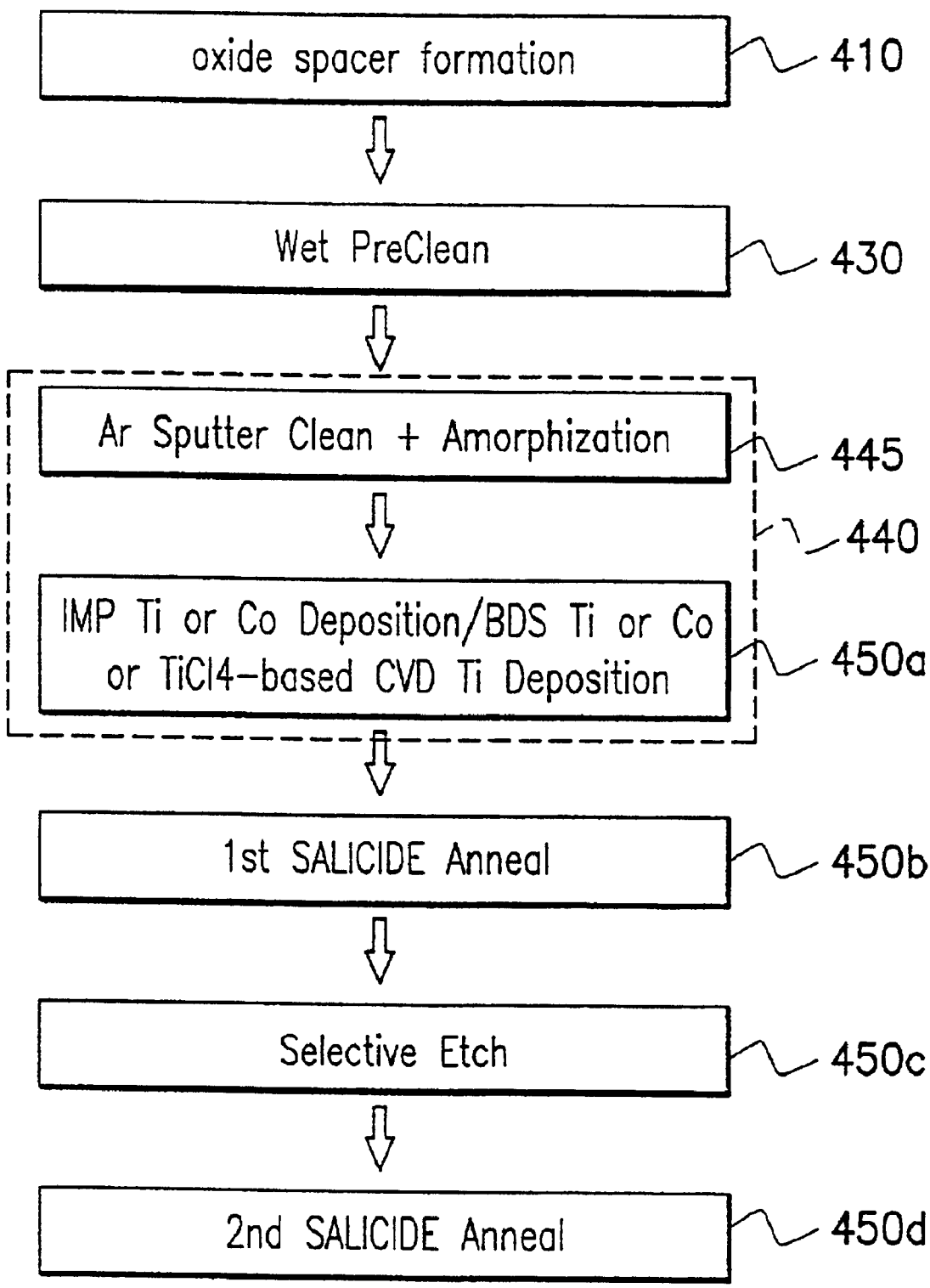
FIG. 2 is a flow chart schematically illustrating a method for treating a substrate according to a preferred embodiment of the present invention.

FIG. 2 is a flow chart schematically illustrating a method for treating a substrate according to a preferred embodiment of the present invention. Note that the figure shows only seven processing steps, which steps are less than the nine processing steps defined in the description of the related art.

Figure 3A:
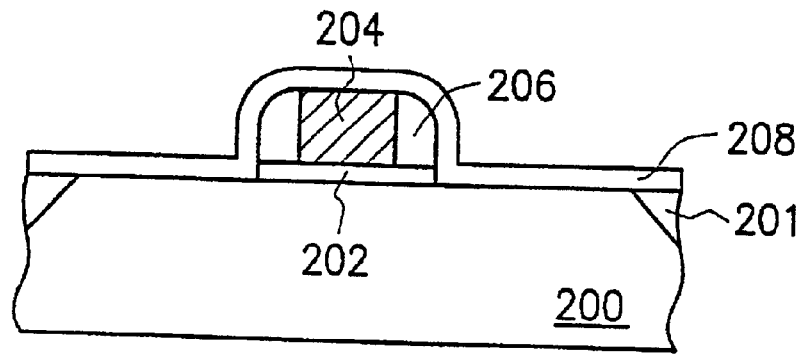
FIGS. 3A–3D are schematic, cross-sectional views of the salicide process.

Referring to FIG. 2, on a silicon substrate having a polysilicon gate thereon step 410 is performed for forming a sidewall spacer on the sidewall of the polysilicon gate. As shown in FIG. 3A, the polysilicon gate 204 is located on an active region defined by an isolation region 201. The polysilicon gate 204 and the substrate 200 are physically and electrically isolated by a gate oxide layer 202. The reference numeral 208 depicts a metal film subsequently deposited.

Still referring to FIG. 2, step 430 and step 445 collectively see as pre-treatment for a salicide process and are performed before the mentioned metal film 208 is deposited. In step 430, the exposed substrate 200, polysilicon gate 204 and sidewall spacer 206 are wet cleaned. In step 445, also a dry surface treatment step, the exposed substrate 200 and polysilicon gate 204 are simultaneously dry cleaned and amorphized in a pre-processing chamber.

The pre-processing chamber, such as the chamber of ionized metal plasma (IMP). is an equipment unit into which the substrate 200 is first transferred from the environment before the substrate 200 is subjected to a salicide process. Several procedures, comprising the dry surface treatment and the metal deposition, may be conducted in the pre-processing chamber. The purpose of the dry surface treatment is to simultaneously amorphize and dry clean the exposed substrate 200 and polysilicon gate 204.

Figure 4:
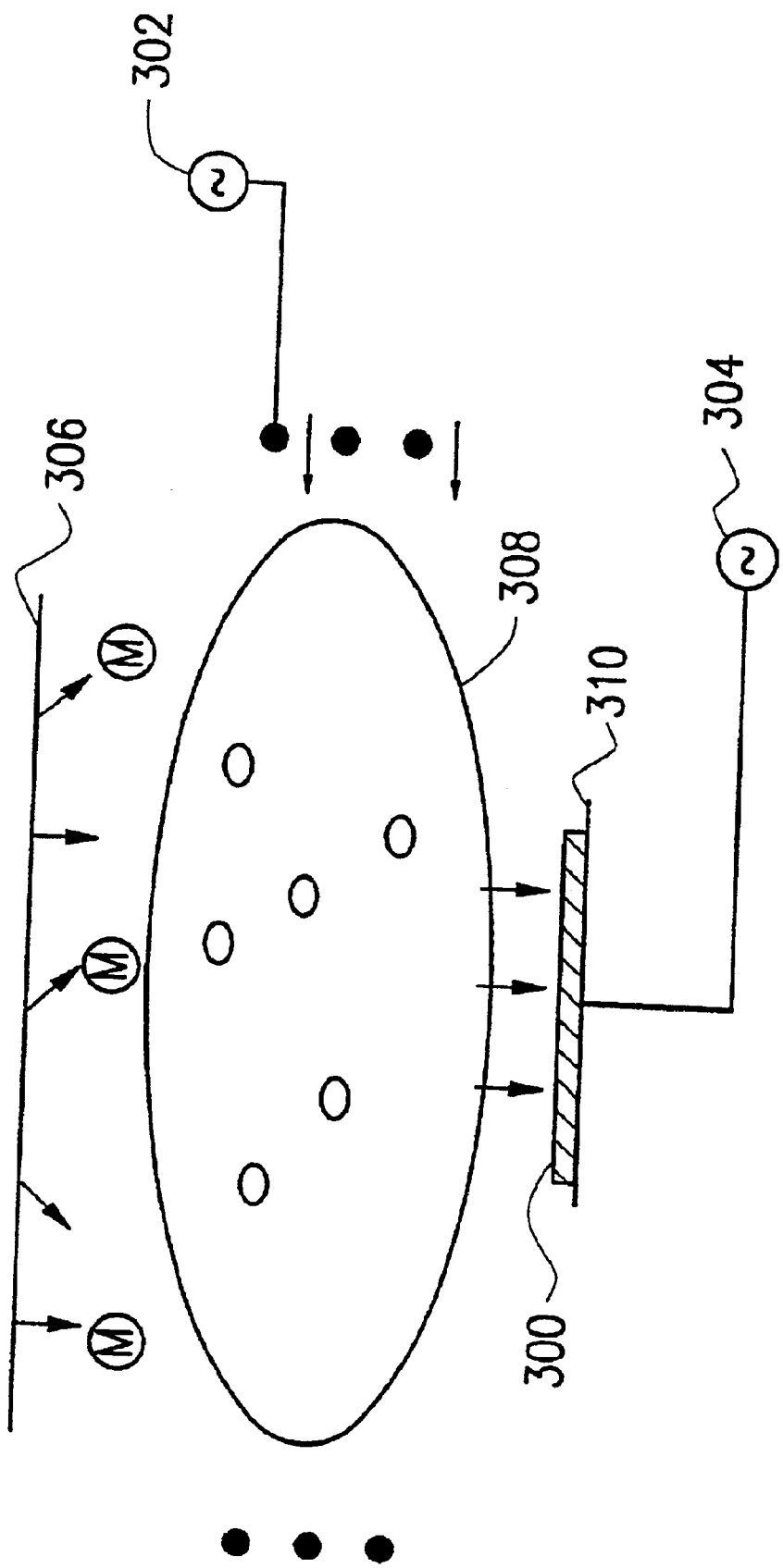
FIG. 4 is a schematic, cross-sectional view of the design of the pre-processing chamber.

FIG. 4 shows the design of the pre-processing chamber. The pre-processing chamber comprises a target 306, first and second RF power supplies 302, 304 for ionizing sputtered metal atoms, and a heater 310 (or E-chuck) for providing the substrate bias. The ionization energy of titanium and argon are 6.8 eV and 15.8 eV, respectively. By proper modification of the RF power, substrate position (such as on the IMP target or on the heater), and substrate bias, argon ions can be manipulated, without argon deposition, to simultaneously dry clean and amorphize the exposed substrate 300 and polysilicon gate. Note that argon (AMU 40) is heavier than silicon (AMU 28), and is therefore more efficient in the amorphization of the exposed substrate 300 and polysilicon gate.

Specifically, when the dry surface treatment is implemented, two power supplies 302, 304 are separately provided to the argon and the heater 310 (also substrate electrode). The power provided to the substrate electrode 310 causes the substrate 300 to acquire a self-bias, and thereby accelerates argon ions from the target 310 toward the exposed substrate 300 and polysilicon gate. Thus, the exposed substrate 300 and polysilicon gate are subject to some bombardment by the argon ions 308 from the target 310. The argon is preferably provided with a bias of about 250W to about 450W from the first power supply 302, while the substrate 300 is preferably provided with a bias of about 150W to about 300W from the second power supply 304. 450W is an upper limit provided to a conventional IMP chamber, but the upper limit is variable according to the development of plasma equipment. By properly modifying the quantities of the RF power, the substrate bias and the substrate position (preferably on the heater), this dry surface treatment can be harnessed to simultaneously amorphize and clean the exposed substrate 300 and polysilicon gate.

In the description of the related art, the biases provided to the argon and to the substrate 300 are conventionally about 50–300W and 100–150W, respectively. Because the biases are provided only for dry cleaning, rather than for amorphization, they are substantially lower than the biases provided for dry cleaning as well as amorphization in the present invention. In other words, if the biases provided are substantially higher than the biases provided for only dry cleaning in the prior art, they are sufficient to dry clean as well as amorphize the exposed substrate 300 and polysilicon gate. That is, the biases assembly provided in the present invention is not limited to about 250–450W or about 150–300W. Any bias assembly which achieves cleaning as well as the amorphization function is within the scope of the invention. The degree of the amorphization can be adjusted with different degrees of argon ionization or with different substrate biases.

Alternatively, the dry surface treatment can be implemented in another chamber designed similarly to that of the IMP. For example, the chamber of a physical vapor deposition (PVD) equipment unit, having too and bottom electrodes for adjusting bias, is also applicable for implementation of the dry surface treatment without breaking vacuum.

Subsequent to the dry surface treatment, Titanium (Ti) or cobalt (Co) deposition step 450a can be performed in the same chamber as used in the dry surface treatment. In FIG. 2, step 450a and step 445 are enclosed by a dotted line 440 to represent that they can be performed in the same chamber. This in situ deposition step 450a saves the venting/pumping time of chamber replacement, thereby improving the production throughput.

Figure 5:
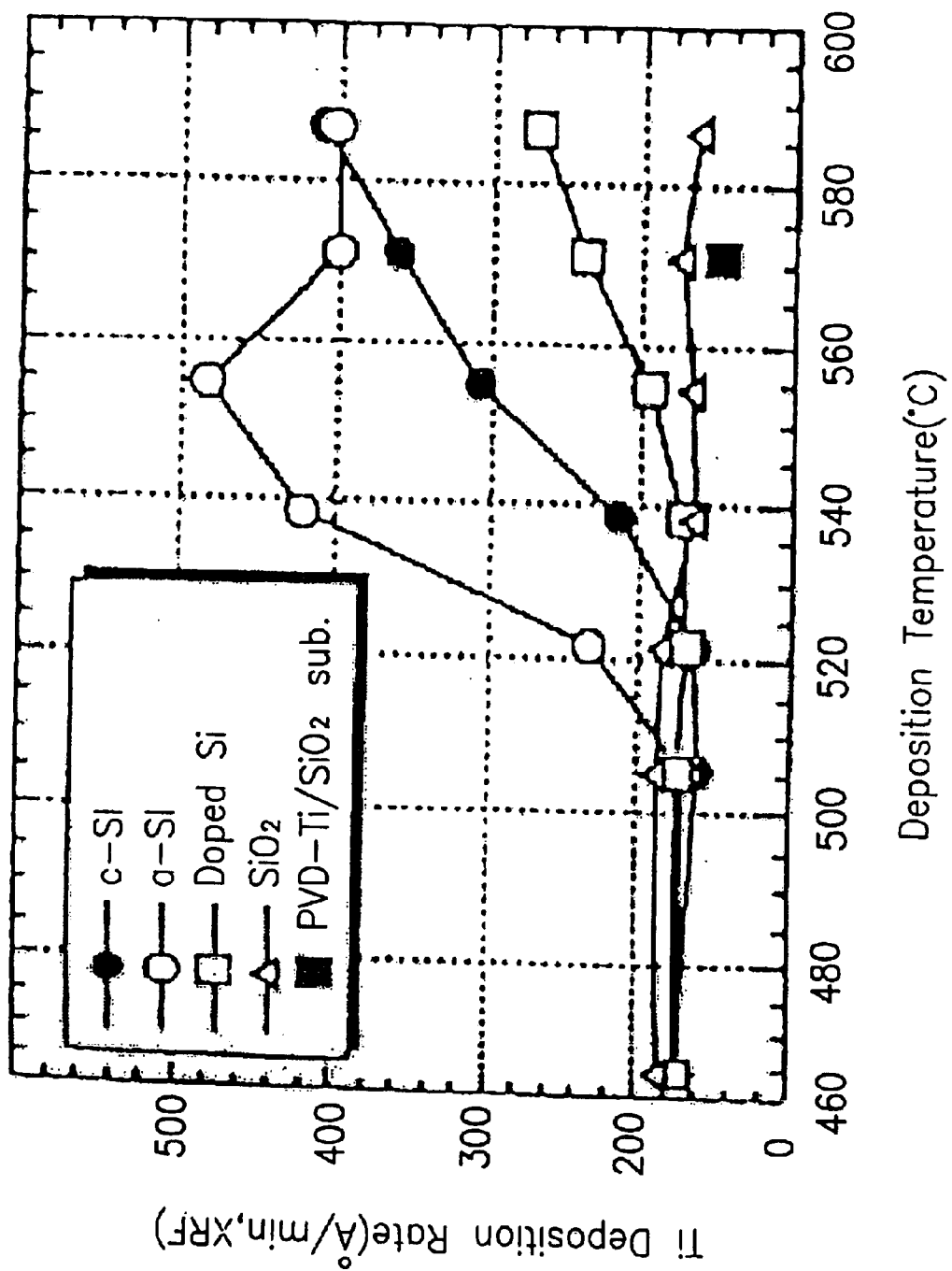
FIG. 5 compares the deposition rate onto an amorphous silicon (a-Si) with the deposition rates onto other materials at various deposition temperature.

FIG. 5 compares the deposition rate onto an amorphous silicon (a-Si) pith the deposition rates onto other materials at various deposition temperatures. The materials include crystalline silicon (c-Si, filled circles), amorphous silicon (a-Si, empty circles), doped silicon (empty squares), silicon oxide ($SiO_2$, empty triangles) and PVD-Ti/$SiO_2$ (filled squares). From FIG. 5, it can be seen that the Ti ($TiCl_4$-based) deposition rate is higher on amorphous silicon than that on any other materials. At about 540° C., the amorphous silicon has a Ti deposition rate three times that on the crystalline silicon. Therefore, in the present invention, the exposed substrate and polysilicon gate are amorphized. Since the amorphization can accelerate the Ti deposition, the thermal budget of the subsequent metal deposition can be lowered either by reducing the deposition time or by lowering the deposition temperature. Because of the lowered thermal budget, junction leakage and the subsequently formed TiSi, thickness can be easily controlled.

Returning to FIG. 2, step 450a through step 450d represent a salicide process implemented after the pre-processing steps have been performed. Schematic, cross-sectional views of the salicide process are correspondingly plotted in FIGS. 3A–3D.

As shown in FIG. 3A, step 450a is performed to deposit a conformal metal film 208 over the substrate 200 in an IMP chamber, PVD chamber, or the like. This deposition step 450a can be alternatively performed by a BDS technique, or by $TiCl_4$-based chemical vapor deposition (CVD). Note that the surfaces of the substrate 200 and the polysilicon gate 204 have been amorphized before the metal film 208 is deposited.

Figure 3B:
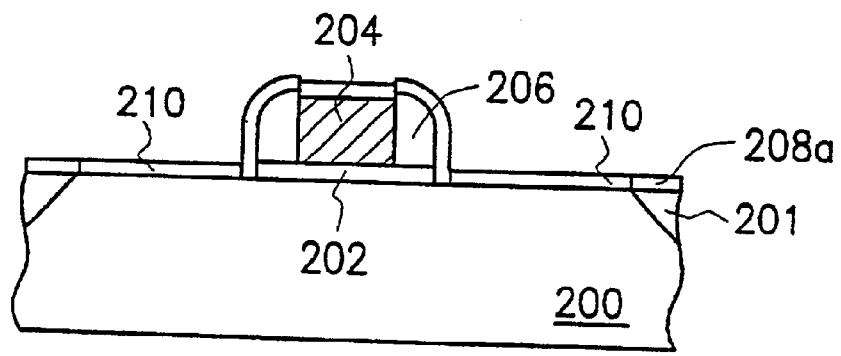

As shown in FIG. 3B, the deposited metal film 208 (Fog. 3A), such as Ti film or Co film, is thermally reacted to form silicide films 210 on the exposed substrate 200 and the exposed polysilicon gate 204. Rapid thermal annealing (RTA) is extensively used in this silicide formation step (1st RTA step 450b).

Figure 3C:
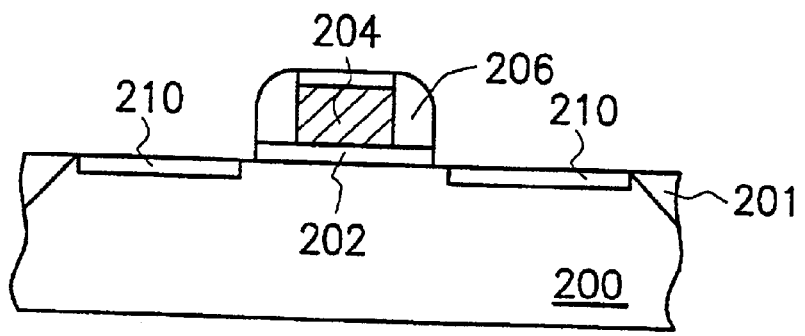

As shown in FIG. 3C, wet etching (etch step 450c) then selectively removes the remaining unreacted metal film 208 from the isolation 201 and the sidewall spacer 206. At this stage, the silicide films 210 are typically in a high-resistance phase.

Figure 3D:
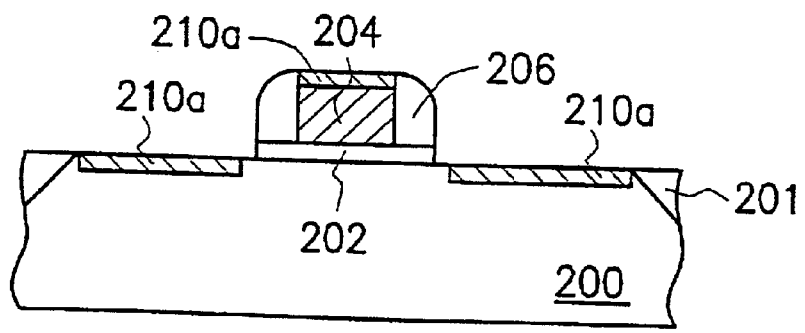

As shown in FIG. 3D, a higher-temperature thermal step (silicide anneal step), typically performed by RTP (2nd RTP 450d), then transforms the silicide films 210 (FIG. 3C) into the desired low-resistance phase 210a.

Several advantages of the present invention are as follows:

1. Using argon plasma to amorphize substrate surface reduces the thermal budget of the following salicide process.
2. The dry surface treatment and Ti/Co deposition steps are performed in the same chamber, thereby improving the wafer throughput.
3. By adjusting the degree of the argon ionization and adjusting the substrate bias, we can control the degree of the amorphization well.
4. The dry surface treatment simultaneously dry cleans and amorphizes the exposed substrate and polysilicon gate, thereby reducing the process costs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for treating a silicon substrate having a surface, comprising:

providing a pre-processing chamber, wherein the pre-processing chamber has first and second power supplies for sputtering argon therein, wherein the first power supply can provide the argon with a first bias, and the second power supply can provide the silicon substrate with a second bias;

placing the silicon substrate into the pre-processing chamber;

providing the first bias to the argon;

providing the second bias to the silicon substrate;

modifying the first bias and the second bias to sputter the argon to simultaneously dry clean and amorphize the substrate surface;

forming a metal film on the amorphized substrate surface;

performing an annealing step, so that the metal film is reacted with the substrate surface to form a metal silicide layer; and removing the metal film which is not reacted with the substrate surface.

2. The method of claim 1, wherein dry cleaning and amorphizing the substrate surface and forming the metal film are performed within the same chamber.

3. The method of claim 1, wherein the metal film is deposited in the pre-processing chamber.

4. The method of claim 1, wherein the metal film is made of cobalt (Co).

5. The method of claim 1, wherein the metal film is deposited by $TiCl_4$-based CVD.

6. The method of claim 1, wherein the metal film is formed on the amorphized substrate surface at a temperature of about 540° C.

* * * * *